United States Patent
Sawada et al.

(10) Patent No.: US 7,795,197 B2
(45) Date of Patent: Sep. 14, 2010

(54) CLEANING LIQUID FOR LITHOGRAPHY AND METHOD FOR RESIST PATTERN FORMATION

(75) Inventors: Yoshihiro Sawada, Kawasaki (JP); Kazumasa Wakiya, Kawasaki (JP); Jun Koshiyama, Kawasaki (JP); Atsushi Miyamoto, Kawasaki (JP); Hidekazu Tajima, Kawasaki (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 391 days.

(21) Appl. No.: 11/791,723

(22) PCT Filed: Nov. 29, 2005

(86) PCT No.: PCT/JP2005/021861

§ 371 (c)(1),
(2), (4) Date: May 29, 2007

(87) PCT Pub. No.: WO2006/062005

PCT Pub. Date: Jun. 15, 2006

(65) Prior Publication Data

US 2008/0096141 A1 Apr. 24, 2008

(30) Foreign Application Priority Data

Dec. 9, 2004 (JP) ............................ 2004-357461
May 17, 2005 (JP) ............................ 2005-144788

(51) Int. Cl.
 *C11D 1/75* (2006.01)
(52) U.S. Cl. ...................... 510/175; 510/176
(58) Field of Classification Search .................. 510/175, 510/176
See application file for complete search history.

(56) References Cited

U.S. PATENT DOCUMENTS

| 4,895,617 A | 1/1990 | Roche et al. |
| 5,972,862 A | 10/1999 | Torii et al. |
| 6,172,029 B1 | 1/2001 | Mizutani et al. |

(Continued)

FOREIGN PATENT DOCUMENTS

CN    1228917    9/1999

(Continued)

OTHER PUBLICATIONS

European Search Report dated Apr. 27, 2010 in corresponding European Patent Application No. 05811391.1.

*Primary Examiner*—Gregory E Webb
(74) *Attorney, Agent, or Firm*—Wenderoth, Lind & Ponack, L.L.P.

(57) ABSTRACT

This invention provides a novel cleaning liquid for lithography that, for a photoresist pattern, is used for reducing a surface defect, that is, defect, of a product, preventing pattern collapse during water rinsing, and further imparting electron beam irradiation resistance to a resist to suppress pattern shrinkage. Further, in the novel cleaning liquid for lithography, bacteria contamination does not occur during storage. The cleaning liquid for lithography comprises an aqueous solution containing an amine oxide compound represented by general formula

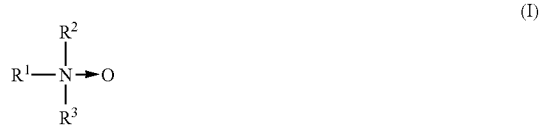

(I)

wherein $R^1$ represents an alkyl or hydroxyalkyl group having 8 to 20 carbon atoms which may be interrupted by an oxygen atom; and $R^2$ and $R^3$ represent an alkyl or hydroxyalkyl group having 1 to 5 carbon atoms.

13 Claims, 1 Drawing Sheet

U.S. PATENT DOCUMENTS

| | | |
|---|---|---|
| 6,268,326 B1 | 7/2001 | Mizutani et al. |
| 6,472,127 B1 | 10/2002 | Takizawa |
| 6,484,735 B1 | 11/2002 | Gordon et al. |
| 6,616,922 B2 * | 9/2003 | Taylor et al. .............. 424/70.28 |
| 6,620,854 B2 * | 9/2003 | Schnyder et al. ............ 514/717 |
| 7,429,446 B2 * | 9/2008 | Sawada et al. .............. 430/311 |
| 2002/0045133 A1 | 4/2002 | Maemori et al. |
| 2003/0138732 A1 | 7/2003 | Nagase |
| 2006/0124586 A1 | 6/2006 | Kobayashi et al. |

FOREIGN PATENT DOCUMENTS

| | | |
|---|---|---|
| CN | 1228917 A | 9/1999 |
| CN | 1257534 | 6/2000 |
| CN | 1257534 A | 6/2000 |
| CN | 1351647 | 5/2002 |
| EP | 0 066 342 | 12/1982 |
| EP | 1 481 660 | 12/2004 |
| GB | 2 197 338 | 5/1988 |
| JP | 7-98498 | 4/1995 |
| JP | 7-319171 | 12/1995 |
| JP | 11-295902 | 10/1999 |
| JP | 2000-250229 | 9/2000 |
| JP | 2001-23893 | 1/2001 |
| JP | 2001-159824 | 6/2001 |
| JP | 2001-356494 | 12/2001 |
| JP | 2002-80892 | 3/2002 |
| JP | 2002-148816 | 5/2002 |
| JP | 2002-323774 | 11/2002 |
| JP | 2003-66624 | 3/2003 |
| JP | 2004-184648 | 7/2004 |
| KR | 1998-018433 | 6/1998 |
| WO | 96/25476 | 8/1996 |
| WO | 00/71662 | 11/2000 |

* cited by examiner

FIG. 1

CLEANING LIQUID FOR LITHOGRAPHY AND METHOD FOR RESIST PATTERN FORMATION

TECHNICAL FIELD

The present invention relates to a cleaning solution for lithography capable of, by being brought into contact with a resist after an image-forming light exposure followed by a development treatment, decreasing the defects after the cleaning treatment, preventing pattern falling in the water rinse, and being effective in suppression of the shrinkage of the pattern caused by electron beam irradiation by improving the electron beam resistance as well as to a resist pattern forming method by using the same.

BACKGROUND TECHNOLOGY

Along with the trend in recent years toward compactness and high integration of semiconductor devices, the light sources for the fine working thereof are also under a trend of shift to shorter wavelength ones from traditional UV light to the g-line capable of forming a resist pattern of higher pattern resolution, from the g-line (436 nm) to the i-line (365 nm) and from the i-line to the KrF excimer laser (248 nm) to accomplish shorter and shorter wavelengths leading to the current ArF excimer laser (193 nm), $F_2$ excimer laser (157 nm) and further electron beams such as EB and EUV shifter as a major current while developments of the process and photoresist materials are under progress at a high pace in order to comply with these short-wavelength light sources.

Conventional photoresists are required to have: for instance, improved sensitivity, pattern resolution, heat resistance, focusing depth latitude and cross sectional profile of a resist pattern to be obtained and improved aging stability resulting in the deterioration of the shape of the resist pattern due to contamination with an amine and the like in a period between light exposure and post-exposure baking (PEB) and controlled substrate dependency which changes are caused in the cross sectional profile of the resist pattern depending on various films provided on the silicon wafer such as insulating films including silicon nitride (SiN) films, semiconductor films including polycrystalline silicon (poly-Si) films and metallic films including titanium nitride (TiN) films. These requirements have been solved to some extent, but a defect which is a particularly important issue has many problems remaining unsolved.

The defect means a mismatch between a resist pattern and the photomask pattern, which is detected when a resist pattern after having been developed is examined from right above with a surface defect observation instrument, for instance, the mismatch like a difference between shapes of the resist patterns, occurrence of scums and contaminants, irregular coloring and coalescence between the patterns and the like. The yield of the semiconductor devices decreases as the number of defects increases so that, even though the resist has the adequate resist characteristics as described above, defects make it difficult for the semiconductor devices to be effectively mass produced, while the problems thereof remain unsolved.

While a variety of factors could be assumable as responsible for these defects, some of them include occurrence of microbubbles during development and re-deposition of insoluble matters once removed by cleaning.

As a method for decreasing such defects, a proposal is made (JP2002-148816A) to improve the formulation of the positive-working resist composition per se to be used for the pattern-formation but such a modification of the composition is undesirable because a modification of the process per se must be accompanied.

Further, a method is proposed (JP2001-23893A) for coating, in the course of resist-pattern forming, with a compound having a hydrophobic group and a hydrophilic group or, namely, with a surfactant but this method has defects that the top portion of the resist pattern is rounded to degrade the orthogonality of the cross section and, in addition, film thickness reduction of the resist layer is caused by this treatment. Moreover, this method requires due selection of the surfactant which must be in good matching with the resist used while, since it is usual in semiconductor processing plant, that the developer solution is supplied through collective pipings in the step of development, this method is inapplicable in a plant using, any kinds of resists necessitating changes of the treatment agents and washing of the pipe lines corresponding to each of the resists.

Furthermore, there are known a method for decreasing the defects in the developing step of photolithography by using a developer solution containing an organic base free from metallic ions and containing a nonionic surfactant as a principal ingredient (JP2001-159824A) and a method for decreasing the defects by conducting a treatment prior to the post-exposure baking treatment by using an aqueous solution of pH 3.5 or lower containing a low-volatile aromatic sulfonic acid and having a molecular weight of at least 200 (JP2002-323774A) but no satisfactory effect can still be reached.

On the other hand, a method of using the composition of a rinsing agent containing a nitrogen-containing compound with a molecular weight of 45 to 10,000, which has an amino group or an imino group, and a hydrocarbon group with 1 to 20 carbon atoms in the molecule, so as to inhibit falling and damage on a resist pattern occurring in a rinsing step and a drying step (JP11-295902A) is also known, but the method of using such a composition of a rinsing agent cannot reduce the above-described defects. Besides, a rinse solution containing an ethylene oxide-based or propylene oxide-based activator (JP2004-184648A) is known, but such a rinse solution cannot inhibit pattern falling because the hydrophilic group has weak interaction with water.

DISCLOSURE OF THE INVENTION

The present invention has been made with an object, under these circumstances, to provide a novel cleaning solution for lithography which is used for forming a photoresist pattern in order to decrease the surface defects of a product, so-called defects, to inhibit pattern falling in rinse with water and to impart resistance to the resist by electron beam irradiation so as to suppress the shrinkage of the pattern along with inhibition of contamination due to bacteria during storage of the solution as well as a resist pattern forming method using the same.

As a result of their extensively continued studies for developing a treatment solution capable of decreasing the defects in the resist pattern obtained without affecting the performance of the cleaning treatment per se and capable of imparting electron beam resistance to the resist resulting in an improvement of the yield, the inventors have arrived at a discovery that a cleaning solution comprising an aqueous solution containing an amine oxide compound with a long-chain alkyl group is effective in decreasing the defects, in preventing pattern falling in the course of water rinse and in imparting electron beam resistance to the resist and that, in the resist pattern formation, when the photoresist film after the alkali-development treatment is treated with the aforementioned solution, the good form of the resist pattern can be retained, defects can be decreased without causing the phenomena of dissolution and swelling along with suppression of pattern shrinkage in the course of electron beam irradiation and inhibition of contamination due to bacteria during storage of the solution is undertaken leading to the present invention on the base of this discovery.

Thus, the present invention provides a cleaning solution for lithography comprising an aqueous solution containing a specified amine oxide compound as well as a resist pattern-forming method characterized by comprising:

(A) a step of providing a photoresist film on a substrate;
(B) a step of selective light-exposure of the said photoresist film through a photomask pattern;
(C) a step of subjecting the aforementioned photoresist film after the light-exposure treatment to a post-exposure baking treatment (referred to hereinbelow as the PEB treatment);
(D) a step of subjecting the aforementioned photoresist film after the PEB treatment to an alkali-development treatment;
(E) a step of treating the aforementioned photoresist film after the alkali-development treatment with the aforementioned rinse solution for lithography; and, according to desire,
(F) a step of a cleaning treatment with pure water.

It is necessary that the cleaning solution for lithography in the present invention contains an amine oxide represented by the general formula, (I)

(in the formula, $R^1$ is an alkyl group or a hydroxyalkyl group having 8 to 20 carbon atoms optionally interrupted with an oxygen atom and each of $R^2$ and $R^3$ is an alkyl group or a hydroxyalkyl group having 1 to 5 carbon atoms).

In the general formula (I), $R^1$ includes a straightly linear or a branched long-chain alkyl group such as, for example, octyl group, nonyl group, decyl group, lauryl group, pentadecyl group, myristyl group, palmityl group, stearyl group and the like. The long-chain alkyl group can be interrupted with an oxygen atom in the carbon chain and examples of such a group include alkyloxyalkylene compounds or alkyl(polyoxyalkylene) compounds represented by the general formula or (provided that R is an alkyl group and n and m are each an integer in such a range that the total number of the carbon atoms in the formula is 8 to 20).

While each of these $R^2$ and $R^3$ is an alkyl group or a hydroxyalkyl group, it is essential in each case that they are each a lower alkyl group or a lower hydroxyalkyl group having 1 to 5 carbon atoms.

When the number of carbon atoms in these $R^2$ and $R^3$ is greater than 5, the amine oxide is hardly soluble in water so that an aqueous solution of a prescribed concentration can be prepared with difficulties.

Preferable alkyl groups are lower alkyl groups having 1 to 3 carbon atoms such as methyl group, ethyl group and propyl group. Preferable hydroxyalkyl groups are lower hydroxyalkyl groups having 1 to 4 carbon atoms such as methylol group, hydroxyethyl group, hydroxypropyl group and hydroxybutyl group. The group can be of a straight chain or a branched chain.

Accordingly, examples of the preferable compounds represented by the above-given general formula (I) wherein each of $R^2$ and $R^3$ is an alkyl group include long-chain alkyl di(lower alkyl)amine oxides such as octyl dimethyl amine oxide, decyl dimethyl amine oxide, lauryl dimethyl amine oxide, cetyl dimethyl amine oxide, stearyl dimethyl amine oxide, nonyl diethyl amine oxide, lauryl diethyl amine oxide, isopentadecyl methyl ethyl amine oxide, stearyl methyl propyl amine oxide and the like. Besides, examples of the preferable compounds wherein each of $R^2$ and $R^3$ is a hydroxyalkyl group include long-chain alkyl di(lower hydroxyalkyl) amine oxides such as lauryl di(hydroxyethyl)amine oxide, cetyl di(hydroxyethyl)amine oxide and stearyl di(hydroxyethyl)amine oxide, long-chain alkyloxyalkyl di(lower alkyl) amine oxides such as dodecyloxyethoxyethoxyethyl dimethyl amine oxide, stearyloxyethyl dimethyl amine oxide and the like.

The aforementioned amine oxide compounds are effective to reduce occurrence of defects and to improve the electron beam resistance as well as to prevent pattern falling in water rinse. Furthermore, various additional advantages are exhibited that substantial changes in dimensions in the resist pattern before or after the cleaning treatment is decreased and a high antistatic function is imparted resulting in a decrease of the defects and shortening of the tact time such as the time for water shake off and cleaning treatment and, additionally, facilitating handling in respect of the high safety and excellent bactericidal preventing function.

In the inventive cleaning solution for lithography, it is preferable to use water alone as the solvent and it is optional there according to desire that a water-miscible organic solvent is contained to such an extent as not to affect the cleaning performance.

The aforementioned water-miscible organic solvent is preferably a monohydric alcohol-type organic solvent such as methanol, ethanol or propanol or a polyhydric alcohol-type organic solvent such as ethylene glycol, propylene glycol, diethylene glycol or glycerin. These can be used singly or can be used as a combination of two kinds or more.

The mixing proportion of these water-miscible organic solvents is selected in the range usually from 0.01 to 10% by mass or, preferably, from 0.1 to 5% by mass relative to the whole mass of the solvents.

The advantage obtained by the admixture of a water-miscible organic solvent is that, in the treatment of wafers with the cleaning solution for lithography, good distribution and diffusion of the solution over the surface can be accomplished with high efficiency even when the wafer is as large as 300 mm or larger.

The concentration of the amine oxide compound in the inventive cleaning solution for lithography is selected in an amount of at least 0.1 ppm or, preferably, 0.5 ppm relative to the whole mass of the cleaning solution when used with an object to decrease the defects or with an object to decrease shrinkage of the resist pattern caused by electron beam irradiation by improving the electron beam resistance or in an amount of at least 10 ppm or, preferably, at least 100 ppm when used with an object to prevent pattern falling in the course of water rinse.

While the concentration of this amine oxide compound has no particular upper limit, the concentration should usually be 10% by mass or lower or, preferably, 3% by mass or lower since an excessively high concentration results in an increase of the amount of pure water used in the subsequent water rinse and in an increase of the time taken for the water rinse. However, a cleaning solution having a concentration as high as 40% by mass or higher can still be employed when in combination with a developer solution for lithography by using an apparatus for dilution.

It is optional according to desire that the inventive cleaning solution for lithography further contains, in addition to the aforementioned amine oxide compound, a polyalkyleneglycol such as polyethyleneglycol, polypropyleneglycol and poly(ethyleneglycol-propyleneglycol) and their alkyl ethers such as methyl ethers and ethyl ethers.

The mixing proportion is selected in the range of 0.001 to 5% by mass or, preferably, 0.01 to 3% by mass relative to the whole mass of the cleaning solution for lithography.

By addition of polyalkyleneglycol or alkyl ether thereof in this way, the improved coating behavior of the cleaning solution can be obtained on the resist pattern.

It is optional according to desire that the inventive cleaning solution for lithography contains a soluble polymer containing a nitrogen atom in the molecular structure or, namely, a polymer soluble in the solvent to be used. The nitrogen atom can be contained in the base molecular chain of a polymer and can be contained in the side chain as a nitrogen-containing substituent.

The soluble polymer containing a nitrogen atom in the base molecular chain is exemplified, for example, by a polymer of lower alkyleneimines or a copolymer of a lower alkyleneimine and another monomer capable of forming a water-soluble polymer by itself, of which polyethyleneimine is particularly preferred in respect of easy availability thereof.

The polyethyleneimine can be easily produced, for example, by polymerization of ethyleneimine in the presence of an acidic catalyst such as carbon dioxide, chlorine, hydrogen bromide, p-toluenesulfonic acid and the like and it is available as a commercial product.

The soluble polymer containing a nitrogen-containing substituent group on the side chain is exemplified by the polymers or copolymers of an unsaturated hydrocarbon having an amino group or a substituted amino group or a nitrogen-containing heterocyclic group. The polymer of an unsubstituted hydrocarbon having an amino group is exemplified, for example, by polyallylamines. The polyallylamine can readily be obtained, for example, by heating allylamine hydrochloride in the presence of a radical polymerization initiator.

The soluble polymer containing a nitrogen-containing substituent group used in the present invention is preferably a water-soluble resin having monomeric units containing a nitrogen-containing heterocyclic group represented by the general formula, (II)

($R^4$ in the formula is a hydrogen atom or a methyl group and X is a nitrogen-containing heterocyclic group).

Examples of the nitrogen-containing heterocyclic group denoted by X in the above-given general formula (II) include, for example, a pyrrolyl group, imidazolyl group, pyrazolyl group, thiazolyl group, oxazolyl group, isoxazolyl group, pyridyl group, pyrazyl group, pyrimidyl group, pyridazyl group, triazolyl group, indolyl group, quinolyl group, butyrolactam group, caprolactam group and the like and also include other nitrogen-containing heterocyclic groups.

The bonding position of these heterocyclic groups is not particularly limitative and can be at a nitrogen atom or can be at a carbon atom.

Such a soluble polymer having a monomeric unit containing a nitrogen-containing heterocyclic group can be prepared, for example, by polymerizing or copolymerizing a monomer having a nitrogen-containing heterocyclic group expressed by the general formula (III)

($R^4$ and X in the formula have the same meanings as above) or a mixture thereof with a monomer capable of singly forming a water-soluble polymer but containing no nitrogen atom. This polymerization or copolymerization can be performed by a method conventionally used for the preparation of polymers or copolymers such as solution polymerization method, suspension polymerization method and the like.

Preferable ones among the monomers represented by the above-given general formula (III) include vinyl imidazole, vinyl imidazoline, vinyl pyridine, vinyl pyrrolidone, vinyl morpholine and vinyl caprolactam, of which vinyl imidazole, vinyl imidazoline and vinyl pyrrolidone are particularly preferable.

The above-mentioned monomers capable of singly forming a water-soluble polymer but containing no nitrogen atoms usable here include, for example, vinyl alcohol, hydroxyalkyl esters of acrylic acid or methacrylic acid and the like. These monomers can be used either singly or can be used as a combination of two kinds or more.

The proportion in this case between the monomer having a nitrogen-containing heterocyclic group and the monomer capable of singly forming a water-soluble polymer is selected in the range of 10:0 to 1:9 or, preferably, 9:1 to 2:8 by mass. When the proportion of the monomer having a nitrogen-containing heterocyclic group is smaller than above, the adsorbing performance onto the resist surface is decreased so that the desired characteristic or, namely, pattern-falling preventing power is decreased. The mass-average molecular weight of this copolymer is selected in the range of 500 to 1500000 or, preferably, 1000 to 50000. As this copolymer, those containing a cationic monomer are particularly preferred.

Such a copolymer is marketed from, for example, BASF Corp. [product names LUVITEC VPI55 K72W and Sokalan HP56] and polyvinylimidazoline is marketed from TOSOH CORP.

The concentration of the above-described soluble polymer in the inventive cleaning solution for lithography is selected in the range of at least 0.1 ppm or, preferably, at least 0.5 ppm relative to the whole mass of the cleaning solution in the case of use with an object to decrease the defects or with an object to decrease shrinkage of the pattern caused by electron beam irradiation by improving the electron beam resistance but, it should be selected in the range of at least 10 ppm or, preferably, at least 0.01% by mass in the case of use with an object to prevent pattern falling in the course of water rinse.

While the concentration of the soluble polymer has no particular upper limit, an unduly high concentration causes increases in the used volume of pure water and in the water-rinse time for the succeeding water rinse so that it is selected in the range, usually, of 10% by mass or lower or, preferably, 5% by mass or lower.

These soluble polymers exhibit a function in conducting the cleaning treatment to further increase the cleaning effect on the resist pattern surface by decreasing the defects due to redeposition of the resist floating in the cleaning solution with a function for preventing redeposition imparted thereto.

It is optional according to desire that the inventive cleaning solution for lithography is admixed with an acid to be rendered acidic with a pH of 6 or lower or admixed with an amine compound or a quaternary ammonium hydroxide to be rendered basic with a pH of 8 or higher. Addition of such compounds has an effect of preventing in-time degradation of the cleaning solution due to occurrence of bacteria and the like.

Such an acid includes formic acid, acetic acid, propionic acid, butyric acid, isobutyric acid, glycolic acid, oxalic acid, fumaric acid, maleic acid, phthalic acid, peracetic acid, sulfuric acid, trifluoroacetic acid, ascorbic acid and the like.

Further, the amine compound to be used includes monoethanolamine, 2-(2-aminoethoxy)ethanol and the like and the quaternary ammonium hydroxide to be used includes tetramethylammonium hydroxide, tetraethylammonium hydroxide, 2-hydroxyethyl trimethylammonium hydroxide, tetrapropylammonium hydroxide, methyl tripropylammonium hydroxide, tetrabutylammonium hydroxide, methyl tributylammonium hydroxide and the like.

The inventive cleaning solution for lithography is employed for the treatment of a substrate at the stage following the alkali development of the resist film on the substrate after the image forming light exposure. The treatment is undertaken by dipping the substrate bearing the resist film in this treatment solution or by applying or spraying this cleaning solution onto the resist film. A treatment time of 1 to 30 seconds would be sufficient with this cleaning solution.

The inventive cleaning solution for lithography can be satisfactorily employed in the resist pattern forming method comprising:

(A) a step of providing a photoresist film on a substrate;
(B) a step of subjecting the said photoresist film to a selective light-exposure treatment through a photomask pattern;
(C) a step of subjecting the aforementioned photoresist film after the light-exposure treatment to a PEB treatment;
(D) a step of subjecting the aforementioned photoresist film after the PEB treatment to an alkali-development treatment; and
(E) a step of subjecting the aforementioned photoresist film after the alkali-development treatment to a treatment with the aforementioned cleaning solution for lithography.

To describe these steps in more detail, the step (A), firstly, is a step for the formation of a photoresist film on a substrate.

The substrate for use is usually a silicon wafer. While silicon wafers of 8 inches or 12 inches or larger have entered or are entering practical applications, the problems of photoresist pattern falling and the problem of defects occurrence are becoming more and more prominent, particularly high advantages could be obtained in the processes where the silicon wafers used have such a large diameter.

The photoresist composition to be used for the formation of a photoresist film can be any of known ones. With regard to such a photoresist composition, shifts are proceeding from the current lithography by using a resist of a novolac resin applicable to the i-line (365 nm) to the lithographies by using a resist of a hydroxystyrene-based resin applicable to the KrF excimer laser (248 nm) and further a resist of an acrylic resin or a cycloolefin resin applicable to an ArF excimer laser (193 nm) and further, in the liquid-immersion lithography as a promising future lithography with a trend toward increasing fineness of the resist pattern and increasingly high aspect ratios, in which process the problem of photoresist pattern falling and the problem of defects occurrence are more and more remarkable, it would be particularly effective when the silicon wafers used in the process have such a large diameter.

In this step (A), a photoresist film is formed on a substrate such as a silicon wafer which is coated with a solution of a photoresist composition prepared in the aforementioned manner by a spinner and the like followed by a drying treatment.

In step (B), nextly, the resist film formed in step (A) is subjected to a selective light-exposure treatment through a photomask pattern to form a latent image followed by step (C) in which a post-exposure baking treatment (PEB) is undertaken. These step (B) and step (C) are carried out in just the same manner as in the prior art method for the formation of a resist pattern by using a resist.

The resist film after the PEB treatment in this way is then subjected in step (D) to an alkali-development treatment. This alkali-development treatment is carried out, for example, by using an aqueous solution of tetramethyl ammonium hydroxide (referred to hereinbelow as an aqueous TMAH solution) in a concentration of 1 to 10% by mass or, preferably, in a concentration of 2.38% by mass.

It is essential in the formation of a resist pattern according to the inventive method that the aforementioned step (D) or, namely, the alkali-development treatment is followed by the following step (E) in which the resist film should be subjected to a treatment with the aforementioned cleaning solution for lithography.

Since semiconductor devices are usually under mass production where throughput is one of important factors, the treatment time should preferably be as short as possible. This treatment time is selected in the range of 1 to 30 seconds.

The treatment with this cleaning solution for lithography is conducted, for example, by coating or spraying the resist pattern surface with the cleaning solution or by dipping the resist pattern in the cleaning solution.

In the method of the present invention, it is optional to add a step (F), if so desired, which is a step for cleaning with pure water after undertaking the step (E).

In the resist pattern formation, usually, one of the reasons leading to defects is that an alkali-insoluble ingredient in the photoresist composition precipitates out in the course of water rinse after the alkali development to be deposited on the surface of the photoresist film after formation of the resist pattern. When, in the method of the present invention, on the other hand, a treatment is undertaken with the inventive cleaning solution for lithography after development, the resist pattern surface is imparted with a characteristic property of hydrophilicity so that re-deposition of the alkali-dissolved matter in the photoresist onto the resist pattern surface can be suppressed giving rise to an assumption that a particularly great decrease is caused in the redeposition-based defects.

BEST MODE FOR CARRYING OUT THE INVENTION

In the following, a description is given on the best mode for practicing the present invention by way of Examples but the present invention is never limited by these examples.

Incidentally, the properties described in each of the Examples were determined by the methods below.

(1) Defect-Reducing Effect

An 8-inch silicon wafer was coated with an antireflection film-forming agent (a product by Brewer Science, Inc., product name "ARC-29A") and subjected to a heat treatment at 215° C. for 60 seconds to form an antireflection film having a film thickness of 77 nm. A photoresist film of 215 nm film thickness was formed on this antireflection film by coating with a photoresist (a product by TOKYO OHKA KOGYO CO., product name "TARF-P7066") followed by a heat treatment at 130° C. for 90 seconds.

The photoresist film obtained in this way was subjected to a light-exposure treatment by using an ArF excimer laser stepper (a product by Nikon Corp., Model "NSR-S302A") followed by a heat treatment at 130° C. for 90 seconds.

Nextly, a development treatment was undertaken at 23° C. taking 60 seconds by using a 2.38% by mass aqueous solution of tetramethylammonium hydroxide to form a hole pattern having a diameter of 250 nm.

The thus prepared hole pattern wad subjected to a cleaning treatment for 7 seconds at 2000 rpm by using pure water followed by measurement of the number of defects generated on this resist pattern by using a surface defects observation apparatus [product by KLA Tencor Corp., Model "KLA-2351"].

Nextly, the cleaning treatment was undertaken under the same conditions excepting the use of the cleaning solutions for lithography according to the present invention as indicated in Table 1 and Table 2 in place of pure water followed by the measurement of the numbers of defects generated on the resist patterns in the same way as aforementioned taking the percentages of these measured values relative to that by use of pure water as the defects-reducing effects.

(2) Fractions of Patterns Safe from Falling

In the same manner as in (1), focusing was measured under the conditions suitable for the formation of 5 lines of a 80 nm line-and-space pattern at 3 points with displacements of +0.1 μm, 0 μm and −0.1 μm where the exposure dose was adjusted with an increment of 1 mJ within a range of 37 mJ to 41 mJ to count the number of pattern falling in the resist pattern within the wafer surface after the cleaning treatment by using a cathetometric SEM (product by Hitachi High-Technologies Corp., Model "S-9200").

The fraction of the line patterns safe from falling among all of the patterns obtained in this way is given in percentages.

(3) Evaluation of LWR (Line Width Roughness)

In the same manner as in (1), a resist pattern of 90 nm line-and-space pattern was prepared and the surface thereof was subjected to a cleaning treatment at 2000 rpm for 7 seconds by using the cleaning solution for lithography according to the present invention followed by the SEM observation to make evaluation of the line width ruggedness (variations) in the resist patterns within the wafer surface to calculate the standard deviation ($3\sigma$) thereof which was evaluated as the LWR.

(4) Evaluation of Resolving Power

In the same way as in (1), a 90 nm line-and-space resist pattern was prepared and subjected to a cleaning treatment by using the cleaning solution for lithography according to the present invention followed by the SEM observation to make evaluation of the resolving power degradation due to nanodefects and the like in 3 levels below.

A: very excellent orthogonality
B: good orthogonality
C: notably degraded form due to nanodefects

EXAMPLES 1 TO 8

Eight kinds of cleaning solutions for lithography were prepared by dissolving lauryl dimethyl amine oxide in pure water in concentrations of 50 to 1000 ppm, respectively. The properties thereof are shown in Table 1.

TABLE 1

| Example | Concentration of cleaning solution (ppm) | Rate of defects occurrence (%) | Proportion of patterns safe from falling (%) | LWR | Resolving power |
|---|---|---|---|---|---|
| Control | Pure water | 100 | 17 | 11.0 | C |
| Example 1 | 1000 | 0.29 | 57 | 9.5 | A |
| Example 2 | 600 | 0.54 | 52 | 10.2 | B |
| Example 3 | 500 | 0.38 | 55 | 10.0 | A |
| Example 4 | 400 | 0.30 | 45 | 9.8 | A |
| Example 5 | 300 | 0.34 | 41 | 9.5 | A |
| Example 6 | 200 | 2.08 | 41 | 8.0 | A |
| Example 7 | 100 | 12.58 | 25 | 10.5 | B |
| Example 8 | 50 | 51.19 | — | — | — |

EXAMPLE 9-15

Seven kinds of cleaning solutions for lithography were prepared by dissolving lauryl di(hydroxyethyl)amine oxide in pure water in concentrations of 100 to 1000 ppm, respectively. The properties thereof are shown in Table 2.

TABLE 2

| Example | Concentration of cleaning solution (ppm) | Rate of defects occurrence (%) | Proportion of patterns safe from falling (%) | LWR | Resolving power |
|---|---|---|---|---|---|
| Control | Pure water | 100 | 17 | 11.0 | C |
| Example 9 | 1000 | 0.05 | 61 | 9.1 | A |
| Example 10 | 600 | 0.28 | 67 | 9.3 | A |
| Example 11 | 500 | 0.08 | 60 | 8.8 | A |
| Example 12 | 400 | 0.40 | 57 | 8.3 | A |
| Example 13 | 300 | 11.67 | 36 | 9.4 | A |
| Example 14 | 200 | 14.17 | 45 | 9.4 | A |
| Example 15 | 100 | 22.50 | 17 | 10.3 | B |

EXAMPLES 16-21

An antireflection film having a film thickness of 77 nm was formed on an 8-inch silicon wafer by coating with an antireflection film-forming agent (supra) followed by a heating treatment at 215° C. for 60 seconds. This antireflection film was coated with a photoresist (product by TOKYO OHKA KOGYO CO., product name "TARF-P6111") followed by a heating treatment at 130° C. for 90 seconds to form a photoresist film of 460 nm film thickness.

The thus obtained photoresist films were subjected to a light-exposure treatment by using an ArF excimer laser stepper (supra) in exposure doses in the range of 16 to 28 mJ with stepwise increments each by 1 mJ followed by a heat treatment at 130° C. for 90 seconds.

In the next place, a development treatment was undertaken at 23° C. for 60 seconds by using a 2.38% by mass aqueous solution of tetramethylammonium hydroxide to form a 130 nm line-and-space resist pattern.

Nextly, 6 kinds of cleaning solutions were prepared in concentrations of 50 to 1000 ppm indicated in Table 3 below and then cleaning treatments of the aforementioned 130 nm line-and-space resist patterns were undertaken.

Measurements were made by using the cathetometric SEM (supra) for the largest value of the aspect ratios and the smallest values of the CD (line width) of the patterns safe from falling among the resist patterns on the substrate after this treatment to give the results shown in Table 3.

EXAMPLES 22-24

Three kinds of cleaning solutions for lithography were prepared by dissolving lauryl di(hydroxyethyl)amine oxide, tetradecyl dimethyl amine oxide or dodecyloxyethoxyethoxyethyl dimethyl amine oxide expressed by the formula $C_{12}H_{25}$—$(OCH_2CH_2)_3N(CH_3)_2O$ in pure water in a concentration of 300 ppm. Measurements were made by using the cathetometric SEM (supra) for the largest value of the aspect ratios and the smallest values of the CD (line width) of the patterns safe from falling among the resist patterns on the substrate after this treatment to give the results shown in Table 3.

COMPARATIVE EXAMPLE 1

A resist pattern was subjected to a cleaning treatment in just the same manner as in Example 16 excepting the use of pure water as the cleaning solution. Measurements were made by using the cathetometric SEM (supra) for the largest value of the aspect ratios and the smallest value of the CD (line width) of the patterns safe from falling among the resist patterns on the substrate after this treatment to give the results shown in Table 3.

TABLE 3

| | Type of amine oxide | Concentration of cleaning solution (ppm) | Largest value of aspect ratio | Smallest value of CD |
|---|---|---|---|---|
| Example 16 | Lauryl dimethyl amine oxide | 500 | 4.8 | 96 |
| Example 17 | | 1000 | 4.9 | 90 |
| Example 18 | | 300 | 4.8 | 96 |
| Example 19 | | 200 | 4.5 | 102 |
| Example 20 | | 100 | 4.2 | 110 |
| Example 21 | | 50 | 4.2 | 110 |
| Example 22 | Lauryl di(hydroxyethyl) amine oxide | 300 | 4.5 | 102 |
| Example 23 | Tetradecyl dimethyl amine oxide | 300 | 5.1 | 90 |
| Example 24 | Dodecyloxyethoxy-ethoxyethyl dimethyl amine oxide (supra) | 300 | 4.8 | 96 |
| Comparative Example 1 | Pure water | — | 3.8 | 121 |

EXAMPLE 25

An ICP analysis and an atomic absorption spectroscopic analysis were undertaken for the cleaning solution used in Example 16 to determine 11 kinds of elements contained therein including Na, K, Fe, Ca, Mg, Mn, Cu, Al, Cr, Ni and Si to find that the total concentration of all these elements was lower than 3 ppb.

For comparison, a commercially available cleaning solution, which was an aqueous solution containing 1000 ppm of betaine, was subjected to the analysis of the concentrations of all elements under the same conditions to find a concentration of at least 500 ppm. It is understood from this fact that the inventive cleaning solution for lithography is inert against metals (low risk against foreign matters).

EXAMPLE 26

In order to test the cleaning solution for evaluation of the antibacterial performance against multiplication of bacteria, 200 ml of a 500 ppm aqueous solution of lauryl dimethyl amine oxide with addition of 10 ml of city water were subjected to vacuum filtration by using a vacuum filtration system [a product by Millipore Corp., name of the filtration system "Millipore Milliflex-100", name of the filter "Millipore Milliflex-100, Filter Unit MXHABG124"] and the filter after the filtration was subjected to culturing for a week with a liquid for aerobic heterotrophic bacteria [a product by Millipore Corp., product name "Millipore MX00TT220"] as a culture medium.

The results of this culturing were observed to note absolutely no generation of bacteria.

COMPARATIVE EXAMPLE 2

The experiment was undertaken in just the same procedure as in Example 26 excepting the replacement of the cleaning solution in the aforementioned Example 26 with a blockcopolymer of polyethyleneglycol-polypropyleneglycol.

As a result, it was noted with certainty that bacteria were generated at many spots.

It is understood from the above Example 25 and Comparative Example 2 that the cleaning solution heretofore employed conventionally has a possibility of bacterial contamination during storage while the cleaning solution of the present invention for lithography is safe from bacterial contamination during storage.

EXAMPLE 27

An 8-inch silicon wafer was coated with a photoresist (a product by TOKYO OHKA KOGYO CO., product name "TARF-P6111" and a heat treatment was undertaken at 130° C. for 90 seconds to form a photoresist film of 300 nm film thickness.

Onto the thus obtained photoresist film, a 300 ppm aqueous solution of lauryl dimethyl amine oxide as a cleaning solution was dripped for 6 seconds while the wafer was under rotation at 2000 rpm and the electrostatic charges generated thereby were measured by using a measuring instrument [a product by Kasuga Electric Works Ltd., product name "KSD-0303"]

13 to find that the electrostatic charges amounted 4 volts to show no substantial difference as compared with the charges of 6 volts before the cleaning treatment.

EXAMPLE 28

The electrostatic charges were determined in just the same procedures as in Example 27 except that the photoresist in Example 27 was replaced with a photoresist (a product by TOKYO OHKA KOGYO CO., Product name "TARF-P7066") to find that the value was 6 volts to be equivalent to the electrostatic charges of 6 volts before the cleaning treatment.

COMPARATIVE EXAMPLE 3

Electrostatic charges were determined in just the same procedures as in Example 27 except that the cleaning solution in Example 27 was replaced with pure water to find that the value was −8 volts to show a large difference from the value of the electrostatic charges, 6 volts, before the cleaning treatment.

EXAMPLES 29

An antireflection film having a film thickness of 77 nm was formed on an 8-inch silicon wafer by coating with an antireflection film-forming agent (supra) followed by a heating treatment at 215° C. for 60 seconds and then this antireflection film was coated with a photoresist (product by TOKYO OHKA KOGYO CO., product name "TARF-P6111") followed by a heating treatment at 130° C. for 90 seconds to form a photoresist film of 460 nm film thickness.

The photoresist film obtained in this way was subjected to a light-exposure treatment through a 130 nm line-and-space photomask pattern by using an ArF excimer laser stepper (supra) followed by a heat treatment at 130° C. for 90 seconds.

Nextly, a development treatment was undertaken at 23° C. taking 60 seconds by using a 2.38% by mass aqueous solution of tetramethylammonium hydroxide to form a 130 nm line-and-space resist pattern.

Nextly, a cleaning treatment was undertaken by applying a cleaning solution comprising a 500 ppm aqueous solution of lauryl dimethyl amine oxide on the resist pattern surface at 2000 rpm for 7 seconds.

The thus obtained resist pattern was subjected to 30 times repeated electron beam irradiation by using the cathetometric SEM (supra) to determine the line width.

Figure 1:
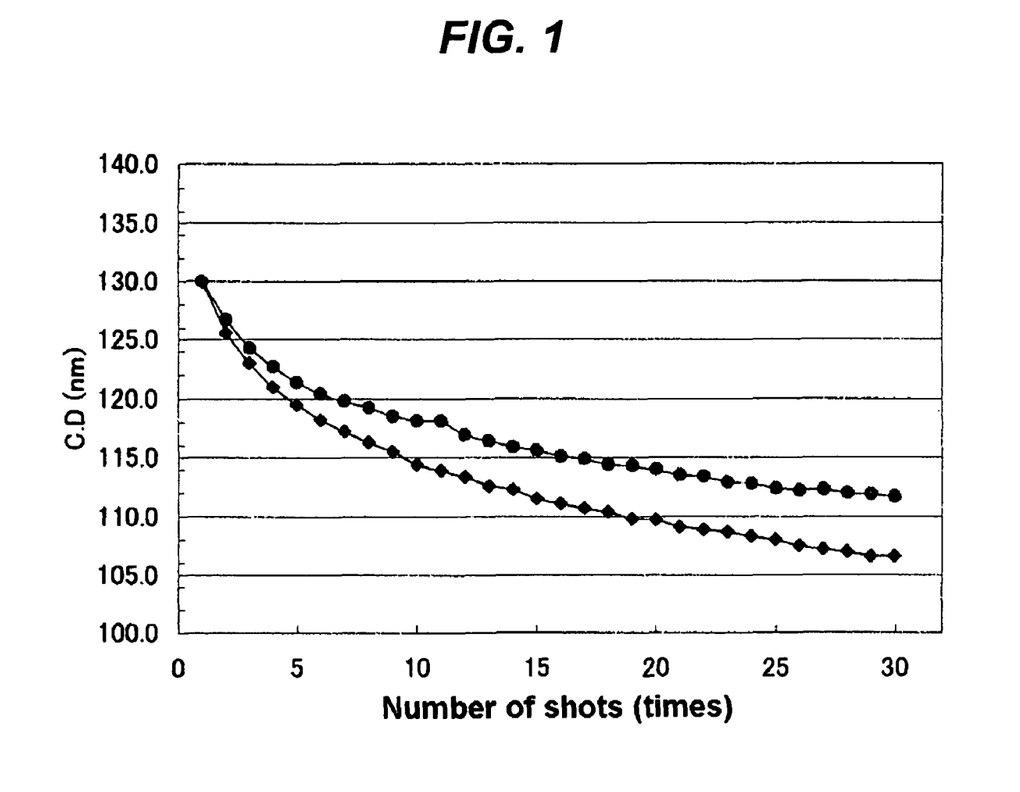
FIG. 1 is a graph showing the relationship of the width contraction with the number of shots obtained in Example 29.

The results are shown in FIG. 1 as a graph taking the number of shots as the abscissa and the line width contraction (nm) as the ordinate.

In the FIGURE, the plots with the marks ● are for cleaning with a cleaning solution of the present invention for lithography and the plots with ♦ are for cleaning with pure water alone.

As is understood from this FIGURE, the use of the inventive cleaning solution for lithography gives rise to about 10% improvement in the film thickness reduction as compared with the case without using the same apparently as a result of improvement in the electron beam resistance.

14

INDUSTRIAL UTILIZABILITY

When the inventive cleaning solution for lithography, which is suitable for uniform distribution and diffusion over a large-size wafer of 300 mm or larger, is used for the treatment of resist patterns after the development treatment, it is possible to decrease falling of the pattern in the course of the cleaning treatment and occurrence of the defects due to the redeposition of once dissolved resin and, in addition, a great decrease could be obtained in the water-shake off time in the rotary drying after cleaning. Besides, reduction of shrinkage of the pattern caused by electron beam irradiation can be obtained by the improvement in the electron beam resistance.

Furthermore, improvements can be obtained in the ruggedness of the line widths of the resist pattern commonly known as LWR (line width roughness) and the roughness of the line edges commonly known as LER (line edge roughness) along with improvement of the resolving power of the pattern. Accordingly, the present invention can be utilized in the manufacture of semiconductor devices such as LSIs, ULSIs and others using the lithographic method.

The invention claimed is:

1. A lithographic photoresist film cleaning solution which consists essentially of at least one kind of an amine oxide compound represented by the general formula:

wherein $R^1$ is an alkyl group or a hydroxyalkyl group having 8 to 20 carbon atoms optionally interrupted with an oxygen atom and each of $R^2$ and $R^3$ is an alkyl group or a hydroxyalkyl group having 1 to 5 carbon atoms, an additional ingredient selected from the group consisting of polyalkylene glycols and polyalkylene glycol alkyl ethers, and at least one solvent selected from the group consisting of water and water-miscible organic solvents.

2. The lithographic photoresist film cleaning solution described in claim 1 wherein each of $R^2$ and $R^3$ in the general formula is an alkyl group having 1 to 5 carbon atoms.

3. The lithographic photoresist film cleaning solution described in claim 1 wherein each of $R^2$ and $R^3$ in the general formula is a hydroxyalkyl group having 1 to 5 carbon atoms.

4. The lithographic photoresist film cleaning solution described in claim 1, wherein the solvent is water.

5. The lithographic photoresist film cleaning solution described in claim 1, wherein the solvent is a mixture of water and a water-miscible organic solvent.

6. The lithographic photoresist film cleaning solution described in claim 5, wherein the water-miscible organic solvent is a monohydoric or polyhydric alcohol-type organic solvent.

7. The lithographic photoresist film cleaning solution described in claim 5, wherein the mixing proportion of the water-miscible organic solvent in the solvent is in the range from 0.01 to 10% by mass.

8. The lithographic photoresist film cleaning solution described in claim 1, wherein the amine oxide compound has a concentration in the range from 0.1 ppm to 10% by mass relative to the whole mass of the cleaning solution for lithography.

9. The lithographic photoresist film cleaning solution described in claim 8, wherein the amine oxide compound has a concentration in the range from 100 ppm to 3% by mass relative to the whole mass of the cleaning solution for lithography.

10. The lithographic photoresist film cleaning solution described in claim 1, wherein the additional ingredient is in a proportion of 0.01 to 5% by mass relative to the whole mass of the lithographic photoresist film cleaning solution.

11. The lithographic photoresist film cleaning solution described in claim 1, wherein the polyalkylene glycol is selected from the group consisting of polyethylene glycol, polypropylene glycol and poly(ethylene glycol-propylene glycol).

12. The lithographic photoresist film cleaning solution described in claim 1, wherein the polyalkylene glycol alkyl ether is selected from the group consisting of polyethylene glycol methyl ether and polypropylene glycol ethyl ether.

13. A lithographic photoresist film cleaning solution which consists of at least one kind of an amine oxide compound represented by the general formula:

wherein $R^1$ is an alkyl group or a hydroxyalkyl group having 8 to 20 carbon atoms optionally interrupted with an oxygen atom and each of $R^2$ and $R^3$ is an alkyl group or a hydroxyalkyl group having 1 to 5 carbon atoms, an additional ingredient selected from the group consisting of polyalkylene glycols and polyalkylene glycol alkyl ethers, and at least one solvent selected from the group consisting of water and water-miscible organic solvents.

* * * * *